United States Patent [19]

Eisenberg

[11] Patent Number: 4,903,283
[45] Date of Patent: Feb. 20, 1990

[54] PHASE DETERMINING CIRCUIT TO GENERATE A PHASE CONTROL SIGNAL, AND METHOD FOR GENERATING SAID SIGNAL

[75] Inventor: Gerd Eisenberg, Rossdorf, Fed. Rep. of Germany

[73] Assignee: BTS Broadcast Televison Systems GmbH, Darmstadt, Fed. Rep. of Germany

[21] Appl. No.: 194,809

[22] Filed: May 17, 1988

[30] Foreign Application Priority Data

Jun. 12, 1987 [DE] Fed. Rep. of Germany ....... 3719582

[51] Int. Cl.$^4$ ............................................... H03L 7/18
[52] U.S. Cl. ........................................ 377/43; 331/18; 328/55; 328/155
[58] Field of Search ............... 377/43; 331/18; 328/55, 328/155, 141

[56] References Cited

U.S. PATENT DOCUMENTS

| 4,216,544 | 8/1980 | Boleda et al. | 377/43 |
| 4,538,119 | 8/1985 | Ashida | 331/18 |
| 4,748,644 | 5/1988 | Silver et al. | 331/18 |
| 4,763,342 | 8/1988 | Ambrusio et al. | 377/43 |

Primary Examiner—John S. Heyman
Attorney, Agent, or Firm—Frishauf, Holtz, Goodman & Woodward

[57] ABSTRACT

The phase of an actual pulse signal (2') with respect to a phase reference pulse signal (1') can be accurately determined and a control output signal in form of a digital number be obtained rapidly depending on the relative temporal position of the phase pulse signals by counting at a high rate with respect to the pulse repetition rate of the phase reference pulse signal and providing count numbers as well as count rates in dependence of the time of occurrence of the actual pulse signal in relation to the reference pulse within a window period; if the actual pulse falls within the window period, the counting rate for the counter is increased, for example by decreasing the division ration of a divider (6), and the starting time for counting after the reference pulse is likewise extended, for example by addressing a starting time counter (4) from a PROM (5) the address of which is changed in dependence on the relationship of the actual pulse and the reference pulse. The steepness of the control curve will thus change and rotate about a center point (C), thereby, within a counter (7) of a given capacity, providing highly accurate control by high resolution due to rapid counting when the actual pulse and the digital pulse are close to or in phase, while permitting ready latching-in or locking-in of the system by counting at a much slower rate if the deviation between the phase of the actual pulse and the desired phase position in relation to the reference pulse is greater.

7 Claims, 1 Drawing Sheet

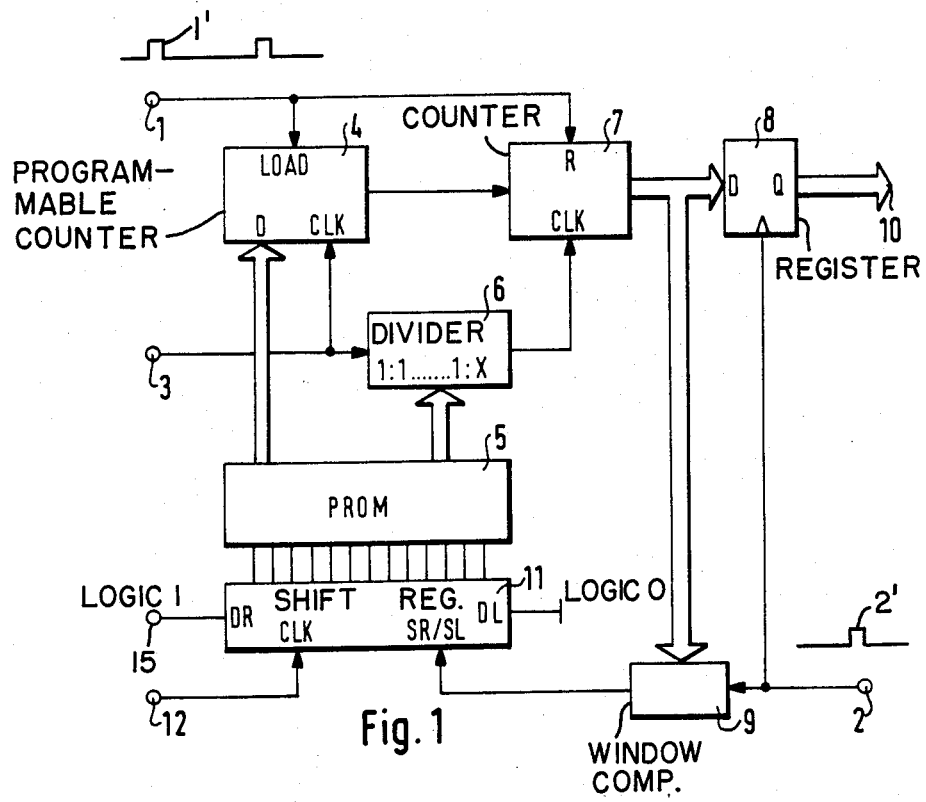
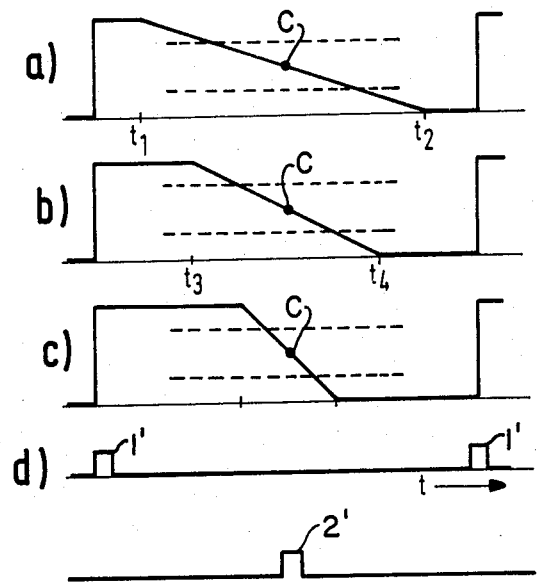
Fig. 2

PHASE DETERMINING CIRCUIT TO GENERATE A PHASE CONTROL SIGNAL, AND METHOD FOR GENERATING SAID SIGNAL

Reference to related applications, by the inventor hereof, assigned to the assignee of the present invention, the disclosure of which is hereby incorporated by reference: U.S. Ser. No. 194,810, filed May 17, 1988, EISENBERG, and U.S. Ser. No. 194,811, filed May 17, 1988, EISENBERG.

The present invention relates to a circuit to obtain a digital phase control, for use in a digital phase controller, and to a method to obtain such a signal, and especially to such a circuit and method suitable to control a motor.

BACKGROUND

It is known to control the phase of operation of a motor by utilizing a digital phase controller which, by means of a counter, generates a phase control signal. counter is started by a phase reference pulse, and operated at a clock frequency which is higher, and preferably substantially higher than the repetition frequency of the phase reference pulses. The motor to be controlled provides, for example by means of an opto-electronic pulse transducer, a scanning pulse which is representative of the actual value of the phase position. The count state which occurs in the counter after the phase reference pulse until the scanning pulse occurs is a value for the phase difference between the scanning pulse from the motor and the phase reference pulse. This count state, then, can be used, as known, to control the operation of the motor.

A control system of this type should reach stable state as quickly as possible. To obtain prompt locking-on or latching of such a control system, it is important to determine the phase difference within a major portion of the cycling time of the sequence of the phase reference pulses. This means that the counter, which is started by the phase reference pulses should reach its maximum count state only shortly before the subsequent phase reference counting pulse. For precise phase control of the motor, then, counters with correspondingly high count capacity are needed. For example, utilizing an 8-bit counter, permits an accuracy of phase control of 1/256th of the cycling time. Such an accuracy is suitable for some applications, but not for many others. To control the operation of the head wheel of a video tape recorder apparatus, for example, the accuracy is insufficient; substantially higher phase control accuracy is required.

THE INVENTION

It is an object to provide a phase control method and circuit which permits highly accurate phase control without, however, rendering latching-on of the control more difficult, while being essentially immune to disturbances with respect to a latched or locked-on condition.

Briefly, a counter is provided to receive digital input signals, the phase of which is to be determined with reference to phase control pulses. In accordance with a feature of the invention, the counting rate of the counter is controlled to be variable; in accordance with a preferred feature of the invention, the counter may receive a starting signal, the temporal position of which, with respect to the phase reference signal, is variable.

The system and method has the advantage that highly accurate phase control is possible without interfering with the control effect as such. Additionally, the circuit and method has the advantage that optimum matching of amplification of a control loop and temporal resolution of the control values is possible without requiring analog/digital conversion of a control level. Thus, the method and circuit is usable in a digital controller.

The method and circuit can be used not only for control of a motor operating a head wheel of a video tape recorder apparatus, or otherwise for operation of a motor; it can be used as well for various types of phase controls in which high accuracy, with good locking-on or latching-of the controlled element with respect to a reference pulse is important.

Drawings, showing an illustrative embodiment:

FIG. 1 is a general circuit diagram of a system in accordance with the present invention; and FIG. 2, in aligned graphs a to d illustrates operating conditions of the system of FIG. 1, and used in connection with an explanation of the method in accordance with the present invention.

DETAILED DESCRIPTION

An input 1 of the circuit of FIG. 1 has a phase reference signal pulse 1' applied thereto. The input 2 receives a scanning pulse 2' representative, for example, of the actual phase position of a shaft of a motor to be controlled, or, for example, of an element coupled thereto, such as the head wheel of a video tape recorder. A reference clock signal is applied to input 3. The frequency of the reference clock is substantially higher than the frequency of the phase reference pulses applied to terminal 1. In an actual embodiment, for use in control of the head wheel of a video tape recorder, the frequency of the phase reference pulses applied to terminal 1 is 150 Hz; the reference clock at terminal 3 has a frequency of 10 MHz.

A programmable counter 4 has a "load" input connected to the input terminal 1. The programmable counter 4 has a data input D which is connected to a plurality of outputs of a programmable read-only memory (PROM) 5. The reference clock 3 is coupled to the clock input CLK of the programmable counter 4 and, additionally, to a divider 6. The division ratio of the divider is controllable by output signals derived from the PROM 5. The division ratio X is varied, preferably, in binary steps.

The frequency divided clock pulses which may be referred to as counting pulses, are applied to the clock input CLK of a counter 7. The count state of the counter 7 will form the phase control output signal. The counter 7 is started by the programmable counter 4 which emits a signal derived from the programmable counter 4 when the programmable counter 4 has a reached a predetermined count state, for example upon overflow. Any phase pulse 1' applied at terminal 1, which provides the phase reference pulses, resets the counter 7, as shown by the connection between terminal 1 and the R or reset input of the counter 7.

The counter 7 provides parallel data outputs, which are connected on the one hand to a register 8 and, on the other, to input terminals of a window comparator 9. The actual scanning pulses 2', connected to a "store" input of the register 8, provide for storage of the counter state of the counter 7 in the register 8. The outputs 10 then provide this stored value for further processing.

The window comparator, which is a well known structure, constructed in known manner, provides an output signal if the interval between the phase reference signal 1' from terminal 1 and the actual pulse 2' from terminal 2 is within a median value. This output signal controls the input "shift right/shift left", shown at SR/SL of a bidirectional shift register 11. The bidirectional shift register 11 also receives clock pulses from a clock input 12 to the clock terminal CLK. The clock pulses occur shortly before the phase reference pulses at terminal 1. The shift register 11 has two further inputs, namely DR and DL. The terminal DR has a voltage applied thereto corresponding to a value of binary 1; the terminal DL is at voltage level of binary 0. Depending on the value of the signals applied to the terminal SR/SL from the window comparator 9, the content of the bidirectional shift register 11 is shifted towards the right or towards the left. The content of the bidirectional shift register 11 is applied to the PROM 5 to control the addressing therein.

Operation, with reference to FIG. 2: Let it be assumed that, after connection, a phase reference pulse is applied to terminal 1. This sets the counter 4 to such a value that the start signal will be provided after a short period of time as shown in graph a of FIG. 1 at time $t_1$. The divider 6 operates with a high division ratio X, so that the counter pulses will have a relatively low frequency; the counter 7 is clocked comparatively slowly. It will reach its end value at a time $t_2$, shortly before a subsequent phase reference pulse is received at terminal 1. The phase reference pulses 1' at terminal 1 are shown in graph d of FIG. 2.

The count state of the counter 7 is shown in analog manner in graphs 2a to 2c as a straight line; actually, the count state of course will be in step or staircase form, in which the width of any particular step results in an inaccuracy of the control system.

As soon as the control has settled to steady state or, in other words, is latched in, and the phase deviation is small so that the phase reference signal, and while a scanning pulse occurs, is within the range of the broken lines shown in graph a of FIG. 2, window comparator 9 provides a pulse to the bidirectional shift register 11. The bidirectional shift register 11 controls the address of the PROM to change the address of data delivered from the PROM. The changed address provides a different value to the programmable counter 4, so that the programmable counter 4 is set to a value which results in a later starting pulse, namely at time $t_3$, as shown in graph b of FIG. 2. At the same time, the data delivered from the PROM and from a different address set the dividing ratio X of the divider 6 to a value which is less than the previous division, so that the counter 7 will count faster and will reach its end or limiting value at an earlier time, namely at time $t_4$. The faster clocking of the counter 7 provides for more accurate control. If the signal from terminal 2 continues to be within the window range, as graphically shown by the broken lines of graphs a, b, c of FIG. 2, a new initial value is provided for the programmable counter 4 as well as a new division ratio for the divider 6, so that the operating conditions will be as shown in graph c of FIG. 2. As can be seen, any steps of the curves of the graphs a to c will thus be further reduced. Further change of the graph c shown in FIG. 2 is readily possible, so that the curve can still be steeper. The inclined portion of the curve will rotate about the center point C of the control range, which is within the locked-on state of the pulse 2 in the interval between succeeding phase reference pulses from terminal 1. The control thus prevents sudden changes in the control output from the register 8 at line 10, and the rotation of the respective curves of the graphs of FIG. 2 about the center point C prevents transient disturbances when a change of a curve of one slope to that of another is effected by addressing different data in the PROM 5.

A disturbance may cause deviation from the then controlled curve or graph of FIG. 2. If the signal at terminal 2 falls outside the window range of the window comparator 9, the bidirectional shift register is controlled to shift the content thereof in the opposite direction, which will have the result that the curve is changed from a steeper curve, e.g. graph b of FIG. 2, to one which is more shallow, e.g. graph a The disturbance, thus, can be compensated for and controlled and, when the actual pulses from terminal 2 fall within the narrow control range, again, the more accurate or fine control will taken.

Various changes and modifications may be made, and the invention is not limited to the example described; other ways to accomplishing a similar result are possible. For example, the logic circuit formed by the bidirectional shift register 11 and the PROM 5 can be formed by a microprocessor which is suitably programmed. Such a microprocessor may carry out other tasks and other data processing within the circuit described, as well as for other purposes in an overall control system, if this is possible within the required operating and cycling time constraints for controlling the phase position of the pulses from terminal 2 with respect to the reference pulses from terminal 1.

The programmable counter 4 is, for example, a Signetics Integrated Circuit (IC) 74 LS 191. The shift register 11 can be a Signetics 74 LS 194. All other elements, such as the divider 6, counter 7, register 8 and PROM 5, as well as the window comparator 9, are standard articles of commerce and any suitable discrete element or component of a microprocessor may be used therefor.

I claim:

1. Digital phase determining circuit for a digital phase controller to generate digital phase control signals, comprising:

counter means (7) providing digital count signals representative of the generated digital phase control signal;

variable clock rate pulse generating means (3, 6, 5) coupled to the counter means and connected to a source of phase reference pulses (1') for controlling said counter means to operate or count at a controlled and variable rate in dependence on the relative phase or temporal relation between a phase reference pulse signal (1') and an actual pulse signal (2') representative of the actual phase position of a cyclical element under phase control;

start control means (4) coupled to said counter means (7) for starting said counter means at a time which is variable with respect to said phase reference pulse signal (1');

said variable clock rate means and said start control means (4) being jointly controlled to change the clock frequency of the variable clock rate means and the starting time of the counter means (7) under control of the start control means such that a desired phase relation of the actual pulse signal (2') with respect to the reference pulse signal (1') is maintained, and a window comparator (9) connected for receiving output signals from the counter means (7) and the actual pulse signals (2'), said window comparator being coupled to and controlling the variable clock rate means to control the temporal occurrence of the start signal from the start control means (4) in relation to said reference pulse signal (1') and the frequency of the clock rate supplied by the variable clock rate means to the counter means (7).

2. The circuit of claim 1, wherein said variable clock rate means includes a logic circuit (5, 11) coupled to the output of the window comparator (9);

said start control means comprises a programmable counter (4), said logic circuit applying control signal to said programmable counter to control the start instant of said counter means (7);

and a divider (6) is provided, coupled to a fixed clock supply (3), the division ratio of said divider being controlled by the logic circuit (5, 11) and, in turn, providing clock signals at a variable clock rate to said counter (7) in accordance with the controlled division ratio thereof.

3. The circuit of claim 2, wherein said programmable counter (4) has a data input coupled to said logic circuit (5, 11) and a load input coupled to receive the phase reference pulse signal (1').

4. The circuit of claim 3, wherein said clock pulses applied to the divider (6) have a clock rate which is substantially higher than the repetition rate or frequency of said phase reference pulse signals (1').

5. The circuit of claim 2, wherein said logic circuit comprises a bidirectional shift register (11) and a programmable read-only memory (PROM) (5).

6. A method of determining, by digital data processing, the phase of a reference phase pulse signal (1') with respect to an actual phase pulse signal (2') and deriving a control output signal (10) in dependence on the relative temporal position of said phase pulse signals, said method comprising the steps of:

counting, at a clock rate high with respect to the pulse repetition rate of the phase reference pulse signal, and providing counter numbers in dependence on the count number at the time of occurrence of the actual phase pulse signal (2'), and varying the counting clock rate in dependence on deviation of the counter number at which the actual phase pulse signal occurs from a predetermined desired count number by comparing the temporal occurrence of the actual pulse signal (2') within a window range of count numbers and controlling the rate of counting as a function of the extent of deviation of the count number contemporaneous with the actual phase pulse signal (2'), within said range, from said desired count number.

7. A method of determining, by digital data processing, the phase of a reference phase pulse signal (1') with respect to an actual phase pulse signal (2') and deriving a control output signal (10) in dependence on the relative temporal position of said phase pulse signals, said method comprising the steps of:

counting, at a clock rate high with respect to the pulse repetition rate of the phase reference pulse signal, and providing count numbers in dependence on the count number present at the time of occurrence of the actual phase pulse signal (2');

increasing said counting clock rate as the extent of deviation of the count number present at the time of the actual pulse signal (2') from a predetermined desired count number decreases, so that the slope of the counting rate increases as the temporal position of the actual pulse signal (2') with respect to the pulse reference signal (1') causes said desired number to be approached, for thereby reducing the time interval between succeeding count numbers, and decreasing said counting clock rate whenever said deviation extent exceeds a predetermined comparison window range for comparison of count numbers with said predetermined desired count number.

* * * * *